(12) United States Patent
Someya et al.

(10) Patent No.: US 10,280,328 B2
(45) Date of Patent: May 7, 2019

(54) BOTTOM LAYER FILM-FORMING COMPOSITION OF SELF-ORGANIZING FILM CONTAINING STYRENE STRUCTURE

(71) Applicant: NISSAN CHEMICAL INDUSTRIES, LTD., Tokyo (JP)

(72) Inventors: Yasunobu Someya, Toyama (JP); Hiroyuki Wakayama, Toyama (JP); Takafumi Endo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 567 days.

(21) Appl. No.: 14/651,018

(22) PCT Filed: Dec. 16, 2013

(86) PCT No.: PCT/JP2013/083602
§ 371 (c)(1),
(2) Date: Jun. 10, 2015

(87) PCT Pub. No.: WO2014/098025
PCT Pub. Date: Jun. 26, 2014

(65) Prior Publication Data
US 2015/0315402 A1    Nov. 5, 2015

(30) Foreign Application Priority Data
Dec. 18, 2012 (JP) ................. 2012-276134

(51) Int. Cl.
| C09D 125/14 | (2006.01) |
| G02B 1/111 | (2015.01) |
| C09D 153/00 | (2006.01) |
| C09D 125/08 | (2006.01) |
| C08F 212/08 | (2006.01) |
| G03F 7/00 | (2006.01) |
| G03F 7/09 | (2006.01) |

(52) U.S. Cl.
CPC .......... *C09D 125/14* (2013.01); *C08F 212/08* (2013.01); *C09D 125/08* (2013.01); *C09D 153/00* (2013.01); *G02B 1/111* (2013.01); *G03F 7/0002* (2013.01); *G03F 7/09* (2013.01); *Y10T 428/24802* (2015.01)

(58) Field of Classification Search
CPC .................................................... C09D 125/08
See application file for complete search history.

(56) References Cited

U.S. PATENT DOCUMENTS

| 2008/0193658 A1* | 8/2008 | Millward ............ B81C 1/00031 427/401 |
| 2009/0253076 A1 | 10/2009 | Sakaguchi et al. |
| 2009/0311622 A1 | 12/2009 | Sugita et al. |
| 2012/0088188 A1* | 4/2012 | Trefonas ............. B81C 1/00031 430/270.1 |
| 2012/0088192 A1 | 4/2012 | Trefonas et al. |
| 2012/0122036 A1 | 5/2012 | Sugita et al. |
| 2012/0251950 A1 | 10/2012 | Horiguchi et al. |
| 2013/0209755 A1 | 8/2013 | Hustad et al. |

FOREIGN PATENT DOCUMENTS

| JP | 2011-122081 A | 6/2011 |
| JP | 2012-062365 A | 3/2012 |
| JP | 2012-078828 A | 4/2012 |
| JP | 2012-078830 A | 4/2012 |
| JP | 2013-166934 A | 8/2013 |
| JP | 2013-189571 A | 9/2013 |
| JP | 2013-212489 A | 10/2013 |
| JP | 2013-216859 A | 10/2013 |
| WO | 2008/015969 A1 | 2/2008 |
| WO | 2012/046770 A1 | 4/2012 |
| WO | 2012/111694 A1 | 8/2012 |

OTHER PUBLICATIONS

Chen, Yiyan et al., "Conversion of Colloidal Crystals to Polymer Nets: Turning Latex Particles Inside Out.", American Chemical Society, vol. 13, pp. 2697-2704, (2001).
Mar. 25, 2014 International Search Report issued in International Patent Application No. PCT/JP2013/083602.
Mar. 25, 2014 Written Opinion of the International Searching Authority issued in International Patent Application No. PCT/JP2013/083602.
Jun. 21, 2016 Extended European Search Report issued in Patent Application No. 13864564.3.

* cited by examiner

*Primary Examiner* — Ian A Rummel
(74) *Attorney, Agent, or Firm* — Oliff PLC

(57) ABSTRACT

There is provided a composition for forming an underlayer film used for an underlayer of a self-organizing film. An underlayer film-forming composition of a self-organizing film, the underlayer film-forming composition including a polymer made of a unit structure derived from an optionally substituted styrene and a unit structure derived from a crosslink forming group-containing compound, the polymer containing 60 mol % to 95 mol % of the unit structure derived from the styrene and 5 mol % to 40 mol % of the unit structure derived from the crosslink forming group-containing compound relative to the whole unit structures of the polymer. The crosslink forming group is a hydroxy group, an epoxy group, a protected hydroxy group, or a protected carboxy group. The crosslink forming group-containing compound is hydroxyethyl methacrylate, hydroxyethyl acrylate, hydroxypropyl methacrylate, hydroxypropyl acrylate, hydroxystyrene, acrylic acid, methacrylic acid, glycidyl methacrylate, or glycidyl acrylate.

9 Claims, No Drawings

BOTTOM LAYER FILM-FORMING COMPOSITION OF SELF-ORGANIZING FILM CONTAINING STYRENE STRUCTURE

TECHNICAL FIELD

The present invention relates to a composition for forming an underlayer film of a self-organizing film and the self-organizing film formed by thermal baking is used for liquid crystal displays, recording materials for hard disks, solid-state imaging devices, solar cell panels, light emitting diodes, organic light emitting devices, luminescent films, fluorescence films, MEMS, actuators, anti-reflective materials, resists, resist underlayer films, resist upper layer films, templates (molds) for nano-imprinting, or the like. The present invention also relates to a method for forming a self-organizing film using compositions for forming a self-organizing film and an underlayer film of the self-organizing film, and particularly relates to a method for forming a pattern structure formed from the film.

BACKGROUND ART

It has been known that the self-organizing film having a repeating structure in nano-scale has different properties from usual films. A self-organizing film having a repeating structure in nano-scale and using a block copolymer has been suggested.

Properties of a film formed by mixing an organic photochromic material with a non-curable polystyrene/poly(methyl methacrylate) copolymer have been reported.

Properties of nano-patterning by using a non-curable polystyrene/poly(methyl methacrylate) copolymer and formed by using plasma etching have been reported.

Properties of nano-patterning by using a non-curable polystyrene/poly(methyl methacrylate) copolymer have been reported.

A film-forming composition containing a block copolymer, a crosslinking agent, and an organic solvent has been disclosed. In a self-organizing film formed by using the film-forming composition, pattern information can be inputted to the underlayer film (for example, an organic film is used) in order to form a pattern of the block polymer in cylindrical form. In order to arrange patterns at target positions in the underlayer film (for example, an organic film is used) on a processing substrate, the underlayer film is irradiated with ultraviolet rays or radiation rays so that the ultraviolet rays or the radiation rays are overlapped with the arranged positions and whereby unevenness is generated or surface energy (hydrophilicity/hydrophobicity) is changed. This allows each polymer chain (A) component and polymer chain (B) component of the (self-organizing) film-forming composition using the block polymer to arrange at the target positions (refer to Patent Document 1).

Methods for forming an acid-sensitive copolymer containing a styrene unit and then forming a self-organizing layer using the acid-sensitive copolymer as a guide are described (Patent Document 2 and Patent Document 3).

PRIOR ART DOCUMENTS

Patent Documents

Patent Document 1: JP 2011-122081 A
Patent Document 2: JP 2012-078828 A
Patent Document 3: JP 2012-078830 A

SUMMARY OF THE INVENTION

Problem to be Solved by the Invention

An object of the present invention is to provide a composition for forming an underlayer film that is necessary for facilitating the arrangement of the self-organizing film in a desired vertical pattern structure at the time of forming the self-organizing film using a block polymer and the like. In particular, an object of the present invention is to provide an underlayer film that does not cause intermixing (layer mixing) with a self-organizing film as an upper layer and can form a vertical pattern structure in the self-organizing film.

Means to Solve the Problem

The present invention provides, as a first aspect, an underlayer film-forming composition of a self-organizing film, comprising: a polymer consisting of a unit structure derived from an optionally substituted styrene and a unit structure derived from a crosslink forming group-containing compound, the polymer containing 60 mol % to 95 mol % of the unit structure derived from the styrene and 5 mol % to 40 mol % of the unit structure derived from the crosslink forming group-containing compound relative to the whole unit structures of the polymer, as a second aspect, the underlayer film-forming composition of a self-organizing film as described in the first aspect, in which the crosslink forming group is a hydroxy group, an epoxy group, a carboxy group, an amino group, an isocyanate group, a protected hydroxy group, a protected carboxy group, a protected amino group, or a protected isocyanate group, as a third aspect, the underlayer film-forming composition of a self-organizing film as described in the first aspect or the second aspect, in which the crosslink forming group-containing compound is hydroxyethyl methacrylate, hydroxyethyl acrylate, hydroxypropyl methacrylate, hydroxypropyl acrylate, hydroxystyrene, acrylic acid, methacrylic acid, glycidyl methacrylate, or glycidyl acrylate, as a fourth aspect, the underlayer film-forming composition of a self-organizing film as described in any one of the first aspect to the third aspect, further comprising a crosslinking agent, as a fifth aspect, the underlayer film-forming composition of a self-organizing film as described in any one of the first aspect to the fourth aspect, further comprising an acid or an acid generator, as a sixth aspect, the underlayer film-forming composition of a self-organizing film as described in any one of the first aspect to the fifth aspect, in which the self-organizing film is a block polymer comprising an organic polymer chain (A) comprising an organic monomer (a) as a unit structure and a polymer chain (B) comprising a monomer (b) different from the organic monomer (a) as a unit structure and bonding to the organic polymer chain (A), as a seventh aspect, the underlayer film-forming composition of a self-organizing film as described in the sixth aspect, in which the block polymer is a block copolymer made of each combination of polystyrene (A) and polymethyl methacrylate (B), polystyrene (A) and polyisoprene (B), polystyrene (A) and polybutadiene (B), polystyrene (A) and polydimethylsiloxane (B), polystyrene (A) and polyethylene oxide (B), or polystyrene (A) and polyvinyl pyridine (B), as an eighth aspect, a method for forming a pattern structure forming a self-organizing film, the method comprising the steps of: applying the underlayer film-forming composition of a self-organizing film as described in any one of the first aspect to the seventh aspect onto a substrate and baking the applied underlayer film-forming composition to form an underlayer film; and applying a self-organizing film-forming composition on the underlayer film and baking the applied self-organizing film-forming composition, as a ninth aspect, a method for forming a pattern structure forming a self-organizing film, the method comprising the steps of: applying the underlayer film-forming composition of a self-organizing film as described in any one of the first aspect to the seventh aspect onto a substrate and baking the applied underlayer film-forming composition to form an underlayer film; contacting the underlayer film with a solvent to remove a surface layer of the underlayer film; and applying a self-organizing film-forming composition on the underlayer film and baking the applied self-organizing film-forming composition, as a tenth aspect, the method for forming the pattern structure as described in the eight aspect or the ninth aspect, further comprising the step of forming a base film before the step of forming the underlayer film, as an eleventh aspect, the method for forming a pattern structure as described in the tenth aspect, in which the base film is an anti-reflective coating or a hard mask, and as a twelfth aspect, a device obtained by the method for forming a pattern structure as described in any one of the eighth aspect to the eleventh aspect.

Effects of the Invention

The polymer that is contained in the underlayer film-forming composition of the present invention and is consisting of the unit structure derived from styrene and a unit structure derived from a crosslink forming group-containing compound each having a specific ratio can induce a micro-phase separation structure of the block copolymer as the self-organizing film so as to vertically form the micro-phase separation structure to the substrate.

Therefore, use of the underlayer film-forming composition of the present invention for the underlayer film has effects in which the micro-phase separation structure of the self-organizing polymer existing in the upper layer is easily arranged in a desired vertical pattern structure and the self-organizing film having a desired vertical lamellar structure or a vertical cylindrical structure can be formed.

The micro-phase separated self-organizing film as described above can, for example, also form a pattern structure corresponding to a resist pattern using etching rate difference (alkali dissolution rate difference or gas etching rate difference) between the polymer chains contained in the block copolymer.

The underlayer film formed from the underlayer film-forming composition of the present invention does not cause intermixing (layer mixing) with the self-organizing film disposed at the upper layer and can form a vertical pattern structure in the self-organizing film.

MODES FOR CARRYING OUT THE INVENTION

The self-organizing film used in the present invention and obtained by the thermal baking is the block polymer comprising an organic polymer chain (A) comprising an organic monomer (a) as a unit structure and a polymer chain (B) comprising a monomer (b) different from the organic monomer (a) as a unit structure and bonding to the organic polymer chain (A).

In order to induce the micro-phase separation in the block polymer to self-organize, the underlayer film formed from the underlayer film-forming composition of the present invention is used as an underlayer film of the self-organizing film.

The underlayer film is a polymer having a unit structure of vinylnaphthalene and can cause the micro-phase separation of the self-organizing polymer existing at the upper layer and whereby the self-organizing film having a vertical lamellar structure and a vertical cylindrical structure can be formed.

The micro-phase separated self-organizing film as described above may have various applications using a property difference between the polymers of the organic polymer chain (A) and the polymer chain (B). For example, use of the etching rate difference (alkali dissolution rate difference or gas etching rate difference) between the polymers enables the pattern structure corresponding to the resist pattern to be formed.

The present invention provides the underlayer film-forming composition of the self-organizing film comprising the polymer consisting of a unit structure derived from an optionally substituted styrene and a unit structure derived from a crosslink forming group-containing compound, in which the polymer comprises 60 mol % to 95 mol % of the unit structure derived from the optionally substituted styrene and 5 mol % to 40 mol % of the unit structure derived from the crosslink forming group-containing compound relative to the whole unit structures of the polymer.

The polymer may also comprise 70 mol % to 95 mol % of the unit structure derived from the optionally substituted styrene and 5 mol % to 30 mol % of the unit structure derived from the crosslink forming group-containing compound relative to the whole unit structures of the polymer.

The polymer can be obtained by copolymerizing only the optionally substituted styrene and the crosslink forming group-containing compound.

Examples of the substituent may include an alkyl group and the $C_{1-10}$ alkyl group exemplified below can be used. As the substituent, a t-butyl group is preferably used.

The underlayer film-forming composition of the self-organizing film includes the polymer and a solvent and, in addition, may include an acid or an acid generator. A surfactant may be included, if desired.

The underlayer film-forming composition of the self-organizing film is a composition for forming a film existing under the self-organizing film. The film-forming composition is applied onto the substrate and the applied underlayer film-forming composition is baked to form the underlayer film. The self-organizing film-forming composition is applied onto the underlayer film and the applied self-organizing film-forming composition is dried to form the self-organizing film.

The solid content of the underlayer film-forming composition can be 0.01% by mass to 20% by mass, or 0.01% by mass to 15% by mass, or 0.1% by mass to 15% by mass. The solid content is a ratio of remaining substances obtained by removing the solvent and water from the underlayer film-forming composition.

The ratio of the polymer contained in the solid content can be 60% by mass to 100% by mass, or 70% by mass to 99% by mass, or 70% by mass to 99% by mass.

As the crosslink group in the crosslink forming group-containing compound, a hydroxy group, an epoxy group, a carboxy group, an amino group, an isocyanate group, a protected hydroxy group, a protected carboxy group, a protected amino group, or a protected isocyanate group can be used.

Examples of the monomer having the unit structure having the hydroxy group may include a vinyl group-containing hydroxy group derived from hydroxyalkyl (meth)acrylate, vinyl alcohol, and the like and a phenolic hydroxy group of hydroxystyrene and the like.

An alkylene group derived from the $C_{1-10}$ alkyl group exemplified below is used as the alkyl group in hydroxyalkyl (meth)acrylate. Examples of the alkyl group may include a methyl group, an ethyl group, a n-propyl group, an i-propyl group, a n-butyl group, an i-butyl group, a s-butyl group, a t-butyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3 dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and 1-ethyl-2-methyl-n-propyl group. A methyl group, an ethyl group, a propyl group, an iso-propyl group, a butyl group, and the like can be preferably used.

Examples of the monomer having a unit structure having an epoxy group may include a vinyl group-containing epoxy group derived from epoxy (meth)acrylate, glycidyl (meth)acrylate, and the like.

Examples of the monomer having a unit structure having the protected hydroxy group may include a monomer in which the hydroxy group in hydroxystyrene is protected with a tertiary butoxy group. Alternatively, examples of the monomer may include a monomer in which hydroxystyrene is reacted with a vinyl ether compound to protect the hydroxy group. Examples of the vinyl ether compound may include aliphatic vinyl ether compounds having a $C_{1-10}$ alkyl chain and a vinyl ether group such as methyl vinyl ether, ethyl vinyl ether, isopropyl vinyl ether, normal-butyl vinyl ether, 2-ethylhexyl vinyl ether, tert-butyl vinyl ether, and cyclohexyl vinyl ether and cyclic vinyl ether compounds such as 2,3-dihydrofuran, 4-methyl-2,3-dihydrofuran, and 2,3-dihydro-4H-pyran.

Examples of the monomer having a unit structure having a protected carboxy group may include a monomer in which (meth)acrylic acid or vinylbenzoic acid is reacted with a vinyl ether compound to protect a carboxy group. The above-described vinyl ether compound can be exemplified as the vinyl ether compound used here.

Examples of the crosslink forming group may also include the amino group, the isocyanate group, the protected amino group, and the protected isocyanate group. The amino group is required to have at least one active hydrogen. An amino group in which one active hydrogen of this amino group is substituted with an alkyl group or the like can also be used. The above-described alkyl group can be used as this alkyl group.

The protected amino group is an amino group in which at least one hydrogen atom in the amino group is protected with an alkoxycarbonyl group such as a t-butoxycarbonyl group or 9-fluorenylmethoxycarbonyl group.

The protected isocyanate group is a group obtained by reacting an isocyanate group with a protecting agent. The protecting agent is an active hydrogen containing compound that can react with isocyanate. Examples of the protecting agent may include alcohols, phenols, polycyclic phenols, amides, imides, imines, thiols, oximes, lactams, active hydrogen-containing heterocycles, and active methylene-containing compounds.

The alcohols as the protecting agent includes $C_{1-40}$ alcohol. Examples of the alcohols may include methanol, ethanol, propanol, isopropanol, butanol, pentanol, hexanol, octanol, ethylene chlorohydrin, 1,3-dichloro-2-propanol, t-butanol, t-pentanol, 2-ethylhexanol, cyclohexanol, lauryl alcohol, ethylene glycol, butylene glycol, trimethylolpropane, glycerin, ethylene glycol monomethyl ether, ethylene glycol monoethyl ether, ethylene glycol monobutyl ether, diethylene glycol monomethyl ether, propylene glycol monomethyl ether, propylene glycol monoethyl ether, and benzyl alcohol.

The phenols as the protecting agent include $C_{6-20}$ phenols. Examples of the phenols may include phenol, chlorophenol, and nitrophenol.

Phenol derivatives as the protecting agent include $C_{6-20}$ phenol derivatives. Examples of the phenol derivatives may include para-t-butylphenol, cresol, xylenol, and resorcinol.

The polycyclic phenols as the protecting agent include $C_{10-20}$ polycyclic phenols and are aromatic condensed rings having a phenolic hydroxy group. Examples of the polycyclic phenols may include hydroxynaphthalene and hydroxyanthracene.

The amides as the protecting agent include $C_{1-20}$ amides. Examples of the amides may include acetanilide, hexanamide, octandiamide, succinamide, benzenesulfonamide, and ethanediamide.

The imides as the protecting agent include $C_{6-20}$ imides. Examples of the imides may include cyclohexanedicarboximide, cyclohexaenedicarboximide, benzenedicarboximide, cyclobutanedicarboximide, and carbodiimide.

The imines as the protecting agent include $C_{1-20}$ imines. Examples of the imines may include hexane-1-imine, 2-propaneimine, and ethane-1,2-imine.

The thiols as the protecting agent include $C_{1-20}$ thiols. Examples of the thiols may include ethanethiol, butanethiol, thiophenol, and 2,3-butanedithiol.

The oximes as the protecting agent include $C_{1-20}$ oximes. Examples of the oximes may include acetoxime, methyl ethyl ketoxime, cyclohexanone oxime, dimethyl ketoxime, methyl isobutyl ketoxime, methyl amyl ketoxime, formamide oxime, acetaldoxime, diacetyl mono oxime, benzophenone oxime, and cyclohexane oxime.

The lactams as the protecting agent include $C_{4-20}$ lactams. Examples of the lactams may include γ-caprolactam, δ-valerolactam, γ-butyrolactam, β-propyllactam, γ-pyrrolidone, and lauryllactam.

The active hydrogen-containing heterocyclic compounds as the protecting agent include $C_{3-30}$ active hydrogen-containing heterocyclic compounds. Examples of the active hydrogen-containing heterocyclic compounds may include pyrrole, imidazole, pyrazole, piperidine, piperazine, morpholine, pyrindine, indole, indazole, purine, and carbazole.

The active methylene-containing compounds as the protecting agent include $C_{3-20}$ active methylene-containing compounds. Examples of the active methylene-containing compounds may include dimethyl malonate, diethyl malonate, methyl acetoacetate, ethyl acetoacetate, and acetylacetone.

The hydroxy group is preferably used as the crosslink forming group.

The hydroxyalkyl(meth)acrylate is preferable as the crosslink forming group-containing compounds and particularly hydroxyethyl(meth)acrylate can be used.
The polymer used in the underlayer film-forming composition of the self-organizing film of the present invention can be exemplified as follows.
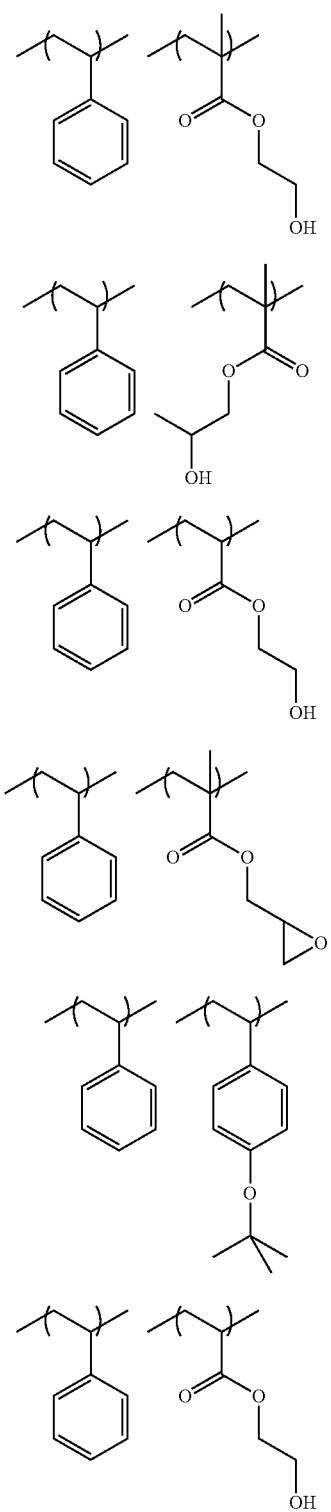
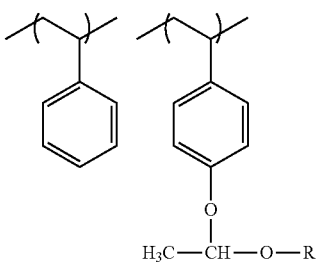

Formula (1-14)

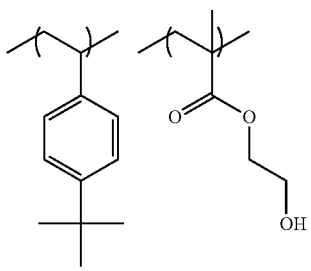

A polymer used for the underlayer film-forming composition of the self-organizing film of the present invention can be used in a range of a weight average molecular weight from 1000 to 200000, or 1000 to 100000, or 1000 to 50000.

The weight average molecular weight can be measured with GPC, for example, in the following GPC measurement conditions: GPC apparatus (trade name HLC-8220GPC, manufactured by TOSOH CORPORATION), GPC columns (trade name Shodex KF803L, KF802, and KF801, manufactured by Showa Denko K.K.), Column temperature: 40° C., Eluent (elution solvent): Tetrahydrofuran, Flow volume (flow rate): 1.0 ml/min, and Standard sample: Polystyrene (manufactured by Shows Denko K.K.).

The underlayer film-forming composition of the self-organizing film of the present invention can contain a crosslinking agent component. Examples of the crosslinking agent may include a melamine-based crosslinking agent, a substituted urea-based crosslinking agent, or polymer-based crosslinking agent of these crosslinking agents. The crosslinking agent preferably has at least two crosslink-forming substituents and examples of the crosslinking agent may include compounds such as methoxymethylated glycoluril, butoxymethylated glycoluril, methoxymethylated melamine, butoxymethyated melamine, methoxymethylated benzoguanamine, butoxymethylated benzoguanamine, methoxymethylated urea, butoxymethylated urea, methoxymethylated thiourea or methoxymethylated thiourea. Condensates of these compounds can also be used.

The amount of added crosslinking agent varies depending on an application solvent used, a base substrate used, a required solution viscosity, a required film shape, and the like. The amount is 0.001% by mass to 80% by mass, preferably 0.01% by mass to 50% by mass, and more preferably 0.05% by mass to 40% by mass relative to the total solid content. These crosslinking agents may cause crosslinking reaction by self-condensation. However, the crosslinking agents can cause a crosslinking reaction with a crosslinkable substituent when the crosslinkable substituent exists in the polymer of the present invention.

In the present invention, acidic compounds such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, and naphthalene carboxylic acid or/and thermal acid generators such as 2,4,4,6-tetrabromocyclohexadienone, benzoin tosylate, 2-nitrobenzyl tosylate, and other organic sulfonic acid alkyl esters can be added as a catalyst for promoting the crosslinking reaction. The amount of the added catalyst is 0.0001% by mass to 20% by mass, preferably 0.0005% by mass to 10% by mass, and preferably 0.01% by mass to 3% by mass relative to the total solid content.

The underlayer film-forming composition of the self-organizing film of the present invention can contain an acid generator.

Examples of the acid generator may include a thermal acid generator and a photoacid generator.

The photoacid generator generates an acid during the exposure of a resist. Consequently, acidity of the underlayer film can be adjusted. This is one method for matching the acidity of the underlayer film with the acidity of the resist disposed at the upper layer. Also, the adjustment of the acidity of the underlayer film enables the pattern shape of the resist formed at the upper layer to be regulated.

Examples of the photoacid generator contained in the resist underlayer film-forming composition of the present invention may include onium salt compounds, sulfonimide compounds, and disulfonyldiazomethane compounds.

Examples of the onium salt compounds may include iodonium salt compounds such as diphenyliodonium hexafluorophosphate, diphenyliodonium trifluoromethanesulfonate, diphenyliodonium nonafluoro-normal-butanesulfonate, diphenyliodonium perfluoro-normal-octanesulfonate, diphenyliodonium camphorsulfonate, bis(4-tert-butylphenyl)iodonium camphorsulfonate, and bis(4-tert-butylphenyl)iodonium trifluoromethanesulfonate and sulfonium salt compounds such as triphenylsulfonium hexafluoroantimonate, triphenylsulfonium nonafluoro-normal-butanesulfonate, triphenylsulfonium camphorsulfonate, and triphenylsulfonium trifluoromethanesulfonate.

Examples of the sulfonimide compounds may include N-(trifluoromethanesulfonyloxy)succinimide, N-(nonafluoro-normal-butane sulfonyloxy)succinimide, N-(camphorsulfonyloxy)succinimide, and N-(trifluoromethanesulfonyloxy)naphthalimide.

Examples of the disulfonyldiazomethane compounds may include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethano, and methylsulfonyl-p-toluenesulfonyldiazomethane.

The photoacid generator can be used singly or in combination of two or more of them.

The ratio of the photoacid generator used is 0.01 part by mass to 5 parts by mass, or 0.1 part by mass to 3 parts by mass, or 0.5 part by mass to 1 part by mass relative to 100 parts by mass of the condensation product (polyorganosiloxane) when the photoacid generator is used.

The underlayer film-forming composition of the present invention may further contain rheology modifiers, adhesion assistance agents, and surfactants in addition to the compounds described above, if necessary.

The rheology modifiers are added for mainly improving the flowability of the underlayer film-forming composition and particularly for enhancing the improvement of film thickness uniformity of the underlayer film-forming composition in the baking process. Examples of the rheology modifiers may include phthalic acid derivatives such as dimethyl phthalate, diethyl phthalate, diisobutyl phthalate, dihexyl phthalate, and butyl isodecyl phthalate; adipic acid derivatives such as di-normal-butyl adipate, diisobutyl adipate, diisooctyl adipate, and octyl decyl adipate; maleic acid derivatives such as di-normal-butyl maleate, diethyl maleate, and dinonyl maleate, oleic acid derivatives such as methyl oleate, butyl oleate, and tetrahydrofurfuryl oleate; and stearic acid derivatives such as normal-butyl stearate and glyceryl stearate. These rheology modifiers is usually contained in a ratio of less than 30% by mass relative to the total solid content of the underlayer film-forming composition.

The surfactants can be contained in the underlayer film-forming composition of the present invention in order to prevent generation of pin holes and striations and to further improve applicability against surface irregularities. Examples of the surfactants may include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303, and EF352 (manufactured by Tochem Products, trade name), MEGAFAC F171, F173, and R-30 (manufactured by Dainippon Ink and Chemicals, Inc., trade name), Fluorad FC430 and FC431 (manufactured by Sumitomo 3M, trade name), and Asahiguard AG710, Surflon S-382, SC101, SC102, SC103, SC104, SC105, and SC106 (manufactured by Asahi Glass Co., Ltd., trade name); and organosiloxane polymer KP 341 (manufactured by Shin-Etsu Chemical Co., Ltd.). The amount of the added surfactant is usually 2.0% by mass or less and preferably 1.0%/o by mass or less relative to the total solid content of the underlayer film-forming composition of the present invention. These surfactants may be used singly or in combination of two or more of them.

Examples of solvents used in the production of the underlayer film-forming composition by dissolving the polymer, the crosslinking agent component, and the crosslinking catalyst in the present invention may include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents may be used singly or in combination of two or more of them.

In addition, these solvents can be used by mixing high boiling point solvents such as propylene glycol monobutyl ether and propylene glycol monobutyl ether acetate. Among these solvents, propylene glycol monomethyl ether, propylene glycol monomethyl ether acetate, ethyl lactate, butyl lactate, and cyclohexanone are preferable for improving a leveling property.

Hereinafter, the use of the underlayer film-forming composition of the self-organizing film of the present invention will be described.

The pattern structure forming the self-organizing film is formed by the step of applying the underlayer film-forming composition of the self-organizing film onto a substrate and baking the applied underlayer film-forming composition to form an underlayer film and the step of applying a self-organizing film-forming composition on the underlayer film and baking the applied self-organizing film-forming composition.

Examples of the substrate may include a silicon wafer substrate, a silicon/silicon dioxide coated substrate, a silicon nitride substrate, a glass substrate, an ITO substrate, a polyimide substrate, and a low dielectric constant material (low-k material) coated substrate.

The underlayer film-forming composition of the present invention is applied onto the substrate by an appropriate application method such as a spinner and a coater and thereafter the applied composition was baked to form the underlayer film.

Conditions for baking are appropriately selected from a baking temperature of 80° C. to 300° C. or 80° C. to 250° C. and a baking time of 0.3 minute to 60 minutes. Preferably, the conditions are a baking temperature of 150° C. to 250° C. and a baking time of 0.5 minute to 2 minutes. The thickness of the formed underlayer film is, for example, 10 nm to 1000 nm, or 20 nm to 500 nm, or 10 nm to 300 nm, or 5 nm to 100 nm.

Subsequently, for example, the layer of the self-organizing film is formed on the underlayer film. The layer of the self-organizing film can be formed by applying the self-organizing film-forming composition solution onto the underlayer film and baking the applied underlayer film. A baking temperature and a baking time are appropriately selected from, for example, 80° C. to 140° C. and 0.3 minute to 60 minutes, respectively. Preferably, the baking temperature and the baking time are about 80° C. to about 120° C. and about 0.5 minute to about 2 minutes, respectively.

The thickness of the self-organizing film is, for example, about 30 nm to about 10000 nm, or about 20 nm to about 2000 nm, or about 10 nm to about 200 nm.

The block polymer comprising an organic polymer chain (A) comprising an organic monomer (a) as a unit structure and a polymer chain (B) comprising a monomer (b) different from the organic monomer (a) as a unit structure and bonding to the organic polymer chain (A) can be used as the self-organizing film used in the present invention.

The solid content of the self-organizing film-forming composition can be set to 0.1% by mass to 70% by mass, or 0.1% by mass to 50% by mass, or 0.1% by mass to 30% by mass. The solid content is a ratio of remaining substances obtained by removing the solvent from the film-forming composition.

The ratio of the block copolymer in the solid content can be set to 30% by mass to 100% by mass, or 50% by mass to 100% by mass, or 50% by mass to 90% by mass, or 50% by mass to 80% by mass.

The types of the blocks existing in the block copolymer may be two, or three or more. The number of the blocks existing in the block copolymer may be two, or three or more.

Change in the polymer chain (B) enables, for example, an adjacent polymer chain (C) containing a monomer (c) as a unit structure to be used.

The block polymer may provide patterns of AB, ABAB, ABA, and ABC.

As one method for synthesizing the block copolymer, the block copolymer is obtained by living radical polymerization and living cation polymerization, in which the polymerization process includes only an initiation reaction and a propagation reaction and does not involve a side reaction that deactivates propagation ends. The propagation end can continuously retain an active propagation reaction during the polymerization reaction. A polymer (A) having almost equal length can be obtained by preventing chain transfer. Addition of a different monomer (b) with the use of the propagation end of the polymer (A) develops polymerization based on the monomer (b) to form a block copolymer (AB).

For example, the molar ratio of the polymer chain (A) and the polymer chain (B) can be set to 1:9 to 9:1 and preferably 3:7 to 5:5 when the blocks contain two blocks of A and B.

A homopolymer A or B is a polymerizable compound having at least one reactive group (a vinyl group or a vinyl group-containing organic group) that is radically polymerizable.

The weight average molecular weight Mn of the block copolymer used in the present invention is preferably 1000 to 100000 or 5000 to 100000. The copolymer having the weight average molecular weight of less than 1000 may have poor applicability to the base substrate, whereas the copolymer having the weight average molecular weight of 100000 or more may have poor solubility into a solvent.

Examples of each of the monomer (a) and monomer (b) forming the block copolymer may include compounds selected from acrylic acid and alkyl esters thereof, methacrylic acid and alkyl esters thereof, N,N-dimethylacrylamide, optionally quaternized dimethylaminoethyl methacrylate, methacrylamide, N-t-butylacrylamide, maleic acid and hemiester thereof, maleic anhydride, crotonic acid, itaconic acid, acrylamide, hydroxylated (meth)acrylate, diallyldimethylammonium chloride, vinylpyrrolidone, vinyl ethers, maleimide, vinylpyridine, vinyl imidazole, heterocyclic vinyl compounds, styrene sulfonate, allyl alcohols, vinyl alcohol, esters of acrylic acid or methacrylic acid of $C_{1-13}$ alcohols, fluoro acrylates, styrene, vinyl acetate, vinyl chloride, vinylidene chloride, vinyl propionate, α-methyl styrene, t-butylstyrene, isoprene, butadiene, cyclohexadiene, ethylene, propylene, and vinyl toluene.

A polystyrene/poly (methyl methacrylate) copolymer, a polystyrene/polyisoprene copolymer, or a polystyrenelpolybutadiene copolymer is preferably used when the block polymer not having or having the crosslinking reaction group is used in the self-organizing film-forming composition used in the present invention. A polystyrene/polydimethylsiloxane copolymer, a polystyrene/polyethylene oxide copolymer, or a polystyrene/polyvinylpyridine copolymer is also preferable.

The block copolymer and the solvent can be added and, if necessary, the following compounds can be further added to the self-organizing film-forming composition used in the present invention. The compounds include a crosslinkable compound, a crosslinking catalyst, a light absorption compound, a surfactant, a hardness adjusting macromolecular compound, an antioxidant, a thermal polymerization inhibitor, a surface modifier, and a defoaming agent.

The self-organizing film-forming composition used in the present invention is usually prepared by dissolving or dispersing the block copolymer containing the two homopolymer chains (A) and (B).

Examples of the organic solvent may include at least one solvent selected from the group consisting of alcohol solvents, ketone solvents, amide solvents, ester solvents, and aprotic solvents.

The following components can be further added to the self-organizing film-forming composition used in the present invention. The components include β-diketones, colloidal silica, colloidal alumina, organic polymers, surfactants, silane coupling agents, radical generators, triazene compounds, and alkali compounds.

Examples of the organic solvent used in the self-organizing film-forming composition used in the present invention may include aliphatic hydrocarbon solvents such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents such as benzene, toluene, xylene, ethylbenzene, trimethylbenzene, methylethylbenzene, n-propylbenzene, i-propyl benzene, diethylbenzene, i-butylbenzene, triethylbenzene, di-i-propylbenzene, n-amylnaphthalene, and trimethylbenzene; monovalent alcohols such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonylalcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenyl methyl carbinol, diacetone alcohol, and cresol; polyvalent alcohols such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethylsulfide, diethylsulfide, thiophene, tetrahydrothiophene, dimethylsulfoxide, sulfolane, and 1,3-propanesultone.

In particular, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferable from the viewpoint of storage stability of the solution of the composition.

A catalyst may be used at the time of thermal curing of the self-organizing film-forming composition. The acid or the acid generator used at the time of curing the underlayer film described above can be used as the catalyst used at the time of the thermal curing.

In order to improve adhesion, wettability to the base substrate, flexibility, and planarization properties, a polymer made by radical polymerizing the following polymerizable compound not containing the block copolymer can be mixed with the self-organizing film-forming composition containing the block copolymer, if necessary. This polymer can be mixed in a mixing ratio of 10 parts by mass to 1000 parts by mass and preferably 10 parts by mass to 100 parts by mass relative to 100 parts by mass of the block copolymer.

As the polymer not containing the block polymer, a crosslink forming polymer can be used. Examples of the polymer not containing the block polymer may include polymers of hydroxystyrene, tris-(2-hydroxyethyl)-isocyanuric acid, and tris-(2-hydroxyethyl)-isocyanuric acid ester (meth)acrylate.

Specific examples of the polymer not containing the block polymer in addition to the above-described polymerizable compounds may include ethylene glycol di(meth)acrylate, diethylene glycol di(meth)acrylate, triethylene glycol di(meth)acrylate, tetracthylene glycol di(meth)acrylate, nonaethylene glycol di(meth)acrylate, polyethylene glycol di(meth) acrylate, tripropylene glycol di(meth)acrylate, tetrapropylene glycol di(meth)acrylate, nonapropylene glycol di(meth)acrylate, polypropylene glycol di(meth)acrylate, 2,2-bis[4-(acryloxydiethoxy)phenyl]propane, 2,2-bis[4-(methacryloxydiethoxy)phenyl]propane, 3-phenoxy-2-propanoyl acrylate, 1,6-bis(3-acryloxy-2-hydroxypropyl)-hexyl ether, pentaerythritol tri(meth)acrylate, trimethylolpropane tri(meth)acrylate, glycerol tri(meth)acrylate, pentaerythritol tetra(meth)acrylate, dipentaerythritol penta(meth)acrylate, and dipentaerythritol hexa(meth)acrylate. For example, ethylene glycol di(meth)acrylate means ethylene glycol diacrylate and ethylene glycol dimethacrylate.

Examples of the polymerizable compounds having an ethylenically unsaturated bond may also include a urethane compound obtained by reacting a polyvalent isocyanate compound with the hydroxyalkyl unsaturated carboxylic acid ester compound, a compound obtained by reacting a polyvalent epoxy compound with the hydroxyalkyl unsaturated carboxylic acid ester compound, a diallyl ester compound such as diallyl phthalate, and a divinyl compound such as divinyl phthalate.

Examples of the polymerizable compounds not containing the block polymer and having a vinyl ether structure may include vinyl-2-chloroethyl ether, vinyl-normal-butyl ether, 1,4-cyclohexanedimethanol divinyl ether, vinyl glycidyl ether, bis(4-(vinyloxymethyl)cyclohexylmethyl) glutarate, tri(ethylene glycol) divinyl ether, adipic acid divinyl ester, diethylene glycol divinyl ether, tris(4-vinyloxy)butyl trimellitate, bis(4-(vinyloxy)butyl) terephthalate, bis(4-(vinyloxy)butyl) isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether.

A crosslinking agent can be used in the self-organizing film-forming composition used in the present invention as an optional component. Examples of the crosslinking agent may include nitrogen-containing compounds having a nitrogen atom that is substituted with a hydroxymethyl group or an alkoxymethyl group. The nitrogen-containing compounds are nitrogen-containing compounds having a nitrogen atom that is substituted with a hydroxymethyl group, a methoxymethyl group, an ethoxymethyl group, a butoxymethyl group, and a hexyloxy methyl group. The crosslinking agent can form crosslink with the block copolymer or the crosslink forming polymer and can form a matrix by self-crosslink to fix the block polymer when the crosslink forming group does not exist in the block copolymer. The crosslinking agent can be used in an amount of 1 part by mass to 50 parts by mass, or 3 parts by mass to 50 parts by mass, or 5 parts by mass to 50 parts by mass, or 10 parts by mass to 40 parts by mass, or 20 parts by mass to 30 parts by mass relative to 100 parts by mass of the block copolymer. Elastic modulus and step coverage can be adjusted by varying the type and the content of the crosslinking agent.

The self-organizing film-forming composition can further contain a crosslinking catalyst that can generate cations or radicals by thermal baking (heating) and can cause the thermal polymerization reaction of the self-organizing film-forming composition used in the present invention. Use of the crosslinking catalyst promotes the reaction of the crosslinking agent.

Examples of the usable crosslinking catalyst may include acid compounds such as p-toluenesulfonic acid, trifluoromethanesulfonic acid, pyridinium p-toluenesulfonate, salicylic acid, camphor sulfonic acid, sulfosalicylic acid, citric acid, benzoic acid, and hydroxybenzoic acid.

As the crosslinking catalyst, aromatic sulfonic acid compounds can be used. Specific examples of the aromatic sulfonic acid compounds may include p-toluenesulfonic acid, pyridinium p-toluenesulfonate, sulfosalicylic acid, 4-chlorobenzene sulfonic acid, 4-hydroxybenzene sulfonic acid, benzene disulfonic acid, 1-naphthalenesulfonic acid and pyridinium 1-naphthalenesulfonate. The crosslinking catalyst may be used singly or in combination of two or more of them.

The crosslinking catalyst can be used in an amount of 0.01 part by mass to 10 parts by mass, or 0.05 part by mass to 5 parts by mass, or 0.1 part by mass to 3 parts by mass, or 0.3 part by mass to 2 parts by mass, or 0.5 part by mass to 1 part by mass relative to 100 parts by mass of the block copolymer.

The method for forming the pattern structure according to the present invention comprises the steps of applying the self-organizing film-forming composition onto the processing substrate to form an applied film, and forming the (self-organizing) film by irradiating the applied film with light or thermally baking the applied film. Liquid crystal displays, recording materials for hard disks, solid-state imaging devices, solar cell panels, light emitting diodes, organic light emitting devices, luminescent films, fluorescence films, MEMS, actuators, anti-reflective materials, resists, resist underlayer films, resist upper layer films, or templates (molds) for nanoimprinting, and the like are produced by using this method.

According to the present invention, before the self-organizing film is formed, the underlayer film-forming composition of the present invention in which pattern information is stored by electron beam drawing and laser Irradiation can be applied. A resist is covered and lithography is carried out or the resist is not covered and lithography is carried out before the formation of the self-organizing film. The resist may not be always required for the use of an efficacy of the block copolymer because the block copolymer itself used in the present invention has a pattern formation ability caused by the self-organization.

Hereinafter, one example of the use of the present invention will be described.

The underlayer film (BrushLayer, Migaku Layer) forming composition of the present invention in which the pattern information is stored by unevenness change or a surface energy change caused by irradiation with electron beam or laser can be applied onto the processing substrate (for example, a silicon/silicon dioxide coated substrate, a silicon wafer substrate, a silicon nitride substrate, a glass substrate, an ITO substrate, a polyimide substrate, and a low dielectric constant material (low-k material) coated substrate) used for the production of semiconductors, liquid crystal displays, recording materials for hard disks, solid-state imaging devices, solar cell panels, light emitting diodes, organic light emitting devices, luminescent films, fluorescence films, MEMS, actuators, anti-reflective materials, resists, resist underlayer films, resist upper layer films, or templates (molds) for nano-imprinting. Then, the self-organizing film-forming composition is applied onto the underlayer film by an appropriate application method such as a spinner, a coater, a spray, or an ink-jet to form an applied film.

For the use of the surface energy change, the value of the water contact angle of the polymer in the underlayer film is preferably a value between the values of each of the water contact angles of the organic polymer chain (A) and the polymer chain (B) of the block polymer.

According to the present invention, the underlayer film is formed by the application and the baking of the underlayer film-forming composition of the present invention on the substrate and then the self-organizing film is formed to cause pattern formation by the self-organizing film. The self-organizing film is applied along a predetermined pattern guide to form a self-organized pattern structure. The pattern guide can be formed by applying, exposing and developing the resist.

The self-organizing film self-organized along the pattern guide has a part that is preferentially removed by development liquid or etching gas depending on the type of the unit structure in the polymer chain constituting the self-organizing film. Shrink in a resist pattern width and formation of a sidewall can be carried out by developing and removing the unit structure.

The photoresist formed by the application is not particularly limited as long as the photoresist is sensitive to light used for exposure. Both negative photoresist and positive photoresist can be used. Subsequently, the photoresist is exposed though a given mask. Subsequently, the photoresist is developed by an alkali development liquid and the like.

Before the (self-organizing) film-forming composition using the block polymer is applied onto the processing substrate, the underlayer film made from the underlayer film-forming composition of the present invention is applied for previously patterning the block polymer to a vertical lamella structure or a vertical cylindrical structure on the processing substrate.

The underlayer film formed from the underlayer film-forming composition of the present invention can self-organize the block polymer by containing a specific ratio of an aromatic vinyl compound. In addition, pattern information can be inputted by changing the surface properties of the underlayer film.

In order to arrange the pattern at target positions in the underlayer film formed from the underlayer film-forming composition of the present invention on the processing substrate, the underlayer film is irradiated with an external stimulation such as heat, ultraviolet ray, laser, or radiation rays so as to overlap with the arrangement positions to cause changes in unevenness or surface energy (hydrophilicity/hydrophobicity). Thus, each of the polymer chain (A) component and the polymer chain (B) component of the (self-organizing film) forming composition using the block polymer can be arranged to target positions.

The inventors of the present invention consider that the aromatic vinyl compound is used in the polymer in the underlayer film used in the present invention and the aromatic rings (for example, naphthalene rings and benzene rings) bonded to the main chain are sensitively sensed by external stimulation to cause morphology change and thus information can be recorded.

Thereafter, the self-organizing film in which an alkali dissolution rate, a solvent dissolution rate, and a gas etching rate vary depending on the type of the unit structure in the polymer chain is arranged at the target positions. The film of the resist is formed, irradiated with ultraviolet rays or radiation rays so that the irradiated position are overlapped to the arrangement positions, and developed. The self-organizing film, in which the alkali dissolution rate and the solvent dissolution rate vary, and the resist are simultaneously dissolved. This provides high contrast development and thus an excellent resist pattern can be formed.

In the present invention, the method for forming the pattern structure that forms the self-organizing film can be used. The method comprises the steps of applying the underlayer film-forming composition of the self-organizing film containing the polymer having a crosslink forming group and baking the applied underlayer film-forming composition to form the underlayer film; contacting the underlayer film with a solvent to remove a surface layer of the underlayer film; and applying a self-organizing film-forming composition thereon and baking the applied self-organizing film-forming composition.

As the solvent contacting to the underlayer film, the solvent used for the underlayer film-forming composition can be used. The surface layer of the underlayer film can be removed by contact to the solvent. Removal of the surface layer results in reduction in the thickness of the underlayer film to $1/10$ or less. The underlayer film can be a thin film having a thickness of, for example, 1 nm to 10 nm.

In the present invention, a base film may be formed before the step of applying the underlayer film-forming composition of the self-organizing film and baking the applied underlayer film-forming composition to form the underlayer film. An anti-reflective coating or a hard mask can be used as the base film.

Hereinafter, the present invention will be further specifically described with reference to Examples. The present invention, however, is not limited to these Examples.

EXAMPLES

Synthesis Example 1

After mixing and dissolving 15.00 g (contained in 90 mol % relative to the total polymer) of styrene, 2.12 g (contained in 10 mol % relative to the total polymer) of hydroxyethyl methacrylate, 0.87 g of 2,2'-azobisisobutyronitrile, and 41.9 g of propylene glycol monomethyl ether acetate, the solution was heated and stirred at 85° C. for about 20 hours. The obtained polymer corresponds to Formula (1-1) above. The weight average molecular weight Mw measured by GPC in terms of polystyrene was 8,800.

Synthesis Example 2

After mixing and dissolving 18.00 g (contained in 80 mol % relative to the total polymer) of styrene, 5.62 g (contained in 20 mol % relative to the total polymer) of hydroxyethyl methacrylate, 1.18 g of 2,2'-azobisisobutyronitrile, and 98.4 g of propylene glycol monomethyl ether acetate, the solution was heated and stirred at 85° C. for about 20 hours. The obtained polymer corresponds to Formula (1-1) above. The weight average molecular weight Mw measured by GPC in terms of polystyrene was 8,100.

Synthesis Example 3

After mixing and dissolving 8.00 g (contained in 80 mol % relative to the total polymer) of styrene, 2.77 g (contained in 20 mol % relative to the total polymer) of 2-hydroxypropyl methacrylate, 0.54 g of 2,2'-azobisisobutyronitrile, and 45.2 g of propylene glycol monomethyl ether acetate, the solution was heated and stirred at 85° C. for about 16 hours. The obtained polymer corresponds to Formula (1-2) above. The weight average molecular weight Mw measured by GPC in terms of polystyrene was 7,500.

Synthesis Example 4

After mixing and dissolving 8.00 g (contained in 80 mol % relative to the total polymer) of styrene, 2.23 g (contained in 20 mol % relative to the total polymer) of hydroxyethyl acrylate, 0.51 g of 2,2'-azobisisobutyronitrile, and 43.0 g of propylene glycol monomethyl ether acetate, the solution was heated and stirred at 85° C. for about 16 hours. The obtained polymer corresponds to Formula (1-3) above. The weight average molecular weight Mw measured by GPC in terms of polystyrene was 8,200.

Synthesis Example 5

After mixing and dissolving 15.00 g (contained in 90 mol % relative to the total polymer) of tert-butylstyrene, 1.35 g (contained in 10 mol % relative to the total polymer) of hydroxyethyl acrylate, 0.82 g of 2,2'-azobisisobutyronitrile, and 51.1 g of propylene glycol monomethyl ether acetate, the solution was heated and stirred at 85° C. for about 16 hours. The obtained polymer corresponds to Formula (1-14) above. The weight average molecular weight Mw measured by GPC in terms of polystyrene was 16,600.

Comparative Synthesis Example 1

After mixing and dissolving 6.0 g (contained in 60 mol % relative to the total polymer) of styrene, 2.0 g (contained in 20 mol % relative to the total polymer) of methyl methacrylate, 2.0 g (contained in 20 mol % relative to the total polymer) of hydroxyethyl methacrylate, 0.50 g of 2,2'-azobisisobutyronitrile, and 42.0 g of propylene glycol monomethyl ether, the solution was heated and stirred at 100° C. for about 16 hours. The obtained polymer corresponds to Formula (2-1) above. The weight average molecular weight Mw measured by GPC in terms of polystyrene was 10,100.

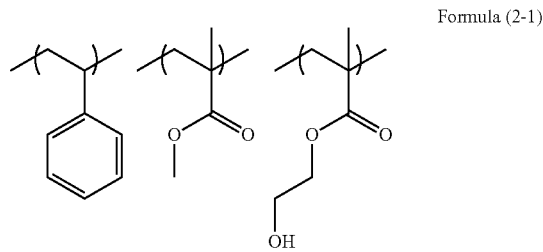

Formula (2-1)

Comparative Synthesis Example 2

After mixing and dissolving 7.00 g (contained in 50 mol % relative to the total polymer) of styrene, 8.8 g (contained in 50 mol % relative to the total polymer) of hydroxyethyl methacrylate, 0.79 g of 2,2'-azobisisobutyronitrile, and 38.6 g of propylene glycol monomethyl ether, the solution was heated and stirred at 85° C. for about 20 hours. The obtained polymer corresponds to Formula (1-1) above. The weight average molecular weight Mw measured by GPC in terms of polystyrene was 9,700.

Example 1

2 g of the resin obtained in Synthesis Example 1 was dissolved in 0.3 g of tetramethoxymethylglycoluril, 0.03 g of pyridinium p-toluenesulfonate, 0.002 g of surfactant (manufactured by DIC Corporation, product name: MEGAFAC (trade name) R-30, the component is fluorine-based surfactant), 6.8 g of propylene glycol monomethyl ether acetate, and 15.8 g of propylene glycol monomethyl ether to prepare a solution. Thereafter, the solution was filtered with a polyethylene microfilter having a pore diameter of 0.2 µm to prepare a solution of an underlayer film-forming composition of the self-organizing film.

Example 2

2 g of the resin obtained in Synthesis Example 2 was dissolved in 0.3 g of tetramethoxymethylglycoluril, 0.03 g of pyridinium p-toluenesulfonate, 0.002 g of surfactant (manufactured by DIC Corporation, product name: MEGAFAC (trade name) R-30, the component is a fluorine-based surfactant), 6.8 g of propylene glycol monomethyl ether acetate, and 15.8 g of propylene glycol monomethyl ether to prepare a solution. Thereafter, the solution was filtered with a polyethylene microfilter having a pore diameter of 0.2 µm to prepare a solution of an underlayer film-forming composition of the self-organizing film.

Example 3

1.7 g of the resin obtained in Synthesis Example 3 was dissolved in 0.3 g of tetramethoxymethylglycoluril, 0.03 g of pyridinium p-toluenesulfonate, 31.0 g of propylene glycol monomethyl ether acetate, and 14.4 g of propylene glycol monomethyl ether to prepare a solution. Thereafter, the solution was filtered with a polyethylene microfilter having a pore diameter of 0.2 µm to prepare a solution of an underlayer film-forming composition of the self-organizing film.

Example 4

1.7 g of the resin obtained in Synthesis Example 4 was dissolved in 0.3 g of tetramethoxymethylglycoluril, 0.03 g of pyridinium p-toluenesulfonate, 31.0 g of propylene glycol monomethyl ether acetate, and 14.4 g of propylene glycol monomethyl ether to prepare a solution. Thereafter, the solution was filtered with a polyethylene microfilter having a pore diameter of 0.2 µm to prepare a solution of an underlayer film-forming composition of the self-organizing film.

Example 5

0.25 g of the resin obtained in Synthesis Example 1 was dissolved in 17.3 g of propylene glycol monomethyl ether acetate and 7.4 g of propylene glycol monomethyl ether to prepare a solution. Thereafter, the solution was filtered with a polyethylene microfilter having a pore diameter of 0.2 µm to prepare a solution of an underlayer film-forming composition of the self-organizing film.

Example 6

0.25 g of the resin obtained in Synthesis Example 5 was dissolved in 17.3 g of propylene glycol monomethyl ether acetate and 7.4 g of propylene glycol monomethyl ether to prepare a solution. Thereafter, the solution was filtered with a polyethylene microfilter having a pore diameter of 0.2 µm to prepare a solution of an underlayer film-forming composition of the self-organizing film.

Comparative Example 1

0.59 g of the resin obtained in Comparative Synthesis Example 1 was dissolved in 0.15 g of tetramethoxymethylglycoluril, 0.01 g of para-phenol sulfonic acid, 14.8 g of propylene glycol monomethyl ether acetate, and 31.4 g of propylene glycol monomethyl ether to prepare a solution. Thereafter, the solution was filtered with a polyethylene microfilter having a pore diameter of 0.2 µm to prepare a solution of an underlayer film-forming composition of the self-organizing film used for a lithography process using a multilayer film.

Comparative Example 2

2 g of the resin obtained in Comparative Synthesis Example 2 was dissolved in 0.3 g of tetramethoxymethylglycoluril, 0.03 g of pyridinium p-toluenesulfonate, 0.002 g of surfactant (manufactured by DIC Corporation, product name: MEGAFAC (trade name) R-30, the component is the a fluorine-based surfactant), 6.8 g of propylene glycol monomethyl ether acetate, and 15.8 g of propylene glycol monomethyl ether to prepare a solution. Thereafter, the solution was filtered with a polyethylene microfilter having a pore diameter of 0.2 µm to prepare a solution of an underlayer film-forming composition of the self-organizing film.

(Elution Test to Photoresist Solvent)

The solutions of an underlayer film-forming composition of a self-organizing film prepared in Examples 1 to 4 and Comparative Examples 1 and 2 were applied onto silicon wafers using a spin coater. The applied films were baked at 240° C. for 1 minute to form underlayer film layers (film thickness 0.20 µm). The immersion tests of these underlayer film layers to the solvent used for resists, for example, ethyl lactate, propylene glycol monomethyl ether (PGME), or propylene glycol monomethyl ether acetate (PGMEA) were carried out. The results are listed in Table 1. The underlayer film layer was immersed in each solvent for 60 seconds and the film thicknesses before and after the immersion were measured. A residual film ratio was a result that was calculated in accordance with (Film thickness after immersion)/(Film thickness before immersion)×100.

TABLE 1

| | Residual film ratio after elution test (%) | | |
|---|---|---|---|
| | | PGME | PGMEA |
| Example 1 | Film after baked at 240° C. | 100% | 100% |
| Example 2 | Film after baked at 240° C. | 100% | 100% |
| Example 3 | Film after baked at 240° C. | 99% | 99% |
| Example 4 | Film after baked at 240° C. | 100% | 98% |
| Comparative Example 1 | Film after baked at 240° C. | 98% | 100% |
| Comparative Example 2 | Film after baked at 240° C. | 100% | 100% |

(Measurement of Dry Etching Rate)

The following etcher and etching gas were used for the measurement of the dry etching rate.

RIE-10NR (manufactured by SAMCO Inc.): $CF_4$

The solutions of an underlayer film-forming composition of a self-organizing film prepared in Examples 1 to 4 and Comparative Examples 1 and 2 were applied onto silicon wafers using a spin coater. The applied films were baked at 240° C. for 1 minute to form underlayer film-forming compositions of the self-organizing film (film thickness 0.20 µm). The dry etching rate was measured using $CF_4$ gas as the etching gas.

The solution of a cresol novolac resin (a commercial product, a weight average molecular weight is 4000) was baked on a silicon wafer at 205° C. for 1 minute using a spin coater to form an organic hard mask layer (a film thickness of 0.20 µm). The dry etching rate of the organic hard mask layer was measured using $CF_4$ as the etching gas in a similar manner to the measurement in Examples 1 to 4 and Comparative Examples 1 and 2. The dry etching rates measured in Examples 1 to 4 and Comparative Examples 1 and 2 were compared with the dry etching rate of the organic hard mask layer. The results are listed in Table 2. The rate ratio (1) is the dry etching rate ratio of (Baked underlayer films of self-organizing film used in Examples 1 to 4 and Comparative Examples 1 and 2 at 240° C. for 1 minute)/(Baked film of the cresol novolac resin at 205° C. for 1 minute). The results are listed in Table 2.

TABLE 2

Dry etching rate ratio

| | | |
|---|---|---|
| Example 1 | Rate ratio (1) of film after baked at 240° C. | 0.87 |
| Example 2 | Rate ratio (1) of film after baked at 240° C. | 0.94 |
| Example 3 | Rate ratio (1) of film after baked at 240° C. | 0.99 |
| Example 4 | Rate ratio (1) of film after baked at 240° C. | 0.96 |
| Comparative Example 1 | Rate ratio (1) of film after baked at 240° C. | 1.14 |
| Comparative Example 2 | Rate ratio (1) of film after baked at 240° C. | 1.05 |

(Adjustment of Block Copolymer)

To 32.33 g of propylene glycol monomethyl ether, 1.0 g of polystyrene/poly(methyl methacrylate) copolymer (manufactured by POLYMER SOURCE INC., PS(18,000)-b-PMMA (18,000), degree of distribution=1.07) as a block copolymer was dissolved to prepare a 2% by mass solution. This solution was filtered with a polyethylene microfilter having a pore diameter of 0.02 μm to prepare the solution of the self-organizing film-forming composition comprising the block copolymer.

(Evaluation of Self-Organization of Block Copolymer)

The solutions of the underlayer film-forming composition of the self-organizing film prepared in Examples 1 to 4 and Comparative Examples 1 and 2 were applied onto silicon wafers and heated on a hot plate at 240° C. for 1 minute to obtain underlayer films (A layers) to exist at underlayer of the self-organizing film. The thickness of the underlayer films was 200 nm.

Each of the underlayer film-forming compositions of the self-organizing film obtained in Examples 5 and 6 was applied onto a silicon wafer and the applied underlayer film-forming composition was heated on a hot plate at 240° C. for 1 minute to obtain underlayer films having a film thickness of 200 nm. Thereafter, the underlayer films were immersed into a mixed solvent of propylene glycol monomethyl ether/propylene glycol monomethyl ether acetate=70/30 for 60 seconds to obtain underlayer films (A layers) to exist at the underlayer of the self-organizing film. The film thickness of the underlayer films was 3 nm.

The self-organizing film-forming composition made of the block copolymer was applied on the underlayer film with a spinner and the applied composition was heated on a hot plate at 100° C. for 1 minute to obtain a self-organizing film (a B layer) having a film thickness of 40 nm. Subsequently, the film was heated on a hot plate under nitrogen atmosphere at 240° C. for 5 minutes to induce the micro-phase separation structure of the block copolymer.

(Observation of Micro-Phase Separation Structure)

The silicon wafer on which the micro-phase separation structure was induced was etched for 3 seconds with the etcher (Lam 2300) manufactured by Lam Research Corp. using $O_2/N_2$ gas as etching gas and whereby the PMMA region was preferentially etched. Subsequently, the shape of the etched sample was observed under the scanning electron microscope (Hitachi S-9380).

[Table 3]

TABLE 3

Observation of shape of block copolymer (self-organizing film) on underlayer film

| | |
|---|---|
| Underlayer film obtained in Example 1 | Vertical lamella |
| Underlayer film obtained in Example 2 | Vertical lamella |
| Underlayer film obtained in Example 3 | Vertical lamella |
| Underlayer film obtained in Example 4 | Vertical lamella |
| Underlayer film obtained in Example 5 | Vertical lamella |
| Underlayer film obtained in Example 6 | Vertical lamella |
| Underlayer film obtained in Comparative Example 1 | Horizontal lamella |
| Underlayer film obtained in Comparative Example 2 | Horizontal lamella |

The underlayer films obtained in Examples 1 to 6 contain a polymer consisting of the unit structure derived from styrene and the unit structure derived from the crosslink forming group-containing compound. These underlayer films can form the micro-phase separation structure of the block copolymer made of polystyrene and polymethyl methacrylate to be induced vertically to the substrate. As seen from the underlayer films obtained in Examples 1 to 6, the capability of inducing the micro-phase separation structure vertically to the substrate is achieved by the polymer consisting of the unit structure derived from styrene and the unit structure derived from the crosslink forming group-containing compound having specific amounts.

On the contrary, the underlayer films obtained in Comparative Examples contain the polymer made of the unit structure derived from styrene, the unit structure derived from the crosslink forming group-containing compound, and further the unit structure derived from other vinyl monomer and these underlayer films dose not enable the micro-phase separation structure of the block copolymer to be induced vertically to the substrate.

INDUSTRIAL APPLICABILITY

The self-organizing film is used for liquid crystal displays, recording materials for hard disks, solid-state imaging devices, solar cell panels, light emitting diodes, organic light emitting devices, luminescent films, fluorescence films, MEMS, actuators, anti-reflective materials, resists, resist underlayer films, resist upper layer films, or templates for nano-imprinting and the like. In the present invention, the polymer consisting of the unit structure derived from styrene and the unit structure derived from the crosslink forming group-containing compound is used for the underlayer film of the self-organizing film and the underlayer film enables the micro-phase separation structure of the block copolymer to be induced vertically to the substrate.

The invention claimed is:

1. An underlayer film-forming composition of a self-organizing film, the underlayer film-forming composition comprising:
a crosslinking agent; and
a polymer consisting of a unit structure derived from an optionally substituted styrene and a unit structure derived from a crosslink forming group-containing compound, the polymer containing 80 mol % to 90 mol % of the unit structure derived from the styrene and 10 mol % to 20 mol % of the unit structure derived from the crosslink forming group-containing compound relative to the whole unit structures of the polymer,
wherein the crosslink forming group-containing compound is one or more of hydroxyethyl methacrylate, hydroxyethyl acrylate or hydroxypropyl methacrylate.

2. The underlayer film-forming composition of a self-organizing film according to claim 1, further comprising an acid or an acid generator.

3. The underlayer film-forming composition of a self-organizing film according to claim 1, wherein the self-organizing film is a block polymer comprising an organic polymer chain (A) comprising an organic monomer (a) as a unit structure and a polymer chain (B) comprising a monomer (b) different from the organic monomer (a) as a unit structure and bonding to the organic polymer chain (A).

4. The underlayer film-forming composition of a self-organizing film according to claim 3, wherein the block polymer is a block copolymer made of each combination of polystyrene (A) and polymethyl methacrylate (B), polystyrene (A) and polyisoprene (B), polystyrene (A) and polybutadiene (B), polystyrene (A) and polydimethylsiloxane (B), polystyrene (A) and polyethylene oxide (B), or polystyrene (A) and polyvinyl pyridine (B).

5. A method for forming a pattern structure forming a self-organizing film, the method comprising the steps of:
applying the underlayer film-forming composition of a self-organizing film as claimed in claim 1 onto a substrate and baking the applied underlayer film-forming composition to form an underlayer film; and
applying a self-organizing film-forming composition on the underlayer film and baking the applied self-organizing film-forming composition.

6. A method for forming a pattern structure forming a self-organizing film, the method comprising the steps of:
applying the underlayer film-forming composition of a self-organizing film as claimed in claim 1 onto a substrate and baking the applied underlayer film-forming composition to form an underlayer film;
contacting the underlayer film with a solvent to remove a surface layer of the underlayer film; and
applying a self-organizing film-forming composition on the underlayer film and baking the applied self-organizing film-forming composition.

7. The method for forming a pattern structure according to claim 5, further comprising the step of forming a base film before the step of forming the underlayer film.

8. The method for forming a pattern structure according to claim 7, wherein the base film is an anti-reflective coating or a hard mask.

9. A device obtained by the method for forming a pattern structure as claimed in claim 5.

* * * * *